United States Patent [19]

Gotou et al.

[11] 3,872,405

[45] Mar. 18, 1975

[54] N-GATE THYRISTOR OSCILLATOR HAVING A PARALLEL CIRCUIT OPERABLE AS A CONSTANT CURRENT CIRCUIT WHEN THE THYRISTOR IS CONDUCTIVE

[75] Inventors: Toshiaki Gotou; Ryuichi Saijo, both of Tokyo, Japan

[73] Assignee: Nippon Electric Company, Limited, Tokyo, Japan

[22] Filed: Mar. 15, 1974

[21] Appl. No.: 451,360

[30] Foreign Application Priority Data

Mar. 31, 1973 Japan ............................... 48-37056

[52] U.S. Cl. ............................... 331/111, 307/252 F

[51] Int. Cl. ............................................ H03k 3/35

[58] Field of Search .......... 307/252 F; 331/111, 143

[56] References Cited

UNITED STATES PATENTS 3,660,686 5/1972 Muskovac ....................... 307/252 F 3,737,731 6/1973 Zeewy ................................ 331/111

*Primary Examiner*—John Kominski

*Attorney, Agent, or Firm*—Ostrolenk, Faber, Gerb & Soffen

[57] ABSTRACT

An N-gate thyristor relaxation oscillator comprises a parallel circuit operable as a constant current circuit for shunting the current that flows through the thyristor when the thyristor is conductive. The parallel circuit may comprise a transistor having its base-collector junction connected between the anode and cathode of the thyristor. The parallel circuit may further comprise a constant voltage circuit, such as a forwardly directed diode or a base-emitter junction of a transistor, connected between the emitter and base electrodes of the first-mentioned transistor.

5 Claims, 4 Drawing Figures

N-GATE THYRISTOR OSCILLATOR HAVING A PARALLEL CIRCUIT OPERABLE AS A CONSTANT CURRENT CIRCUIT WHEN THE THYRISTOR IS CONDUCTIVE

BACKGROUND OF THE INVENTION

This invention relates to a relaxation oscillator comprising an N-gate thyristor. The N-gate thyristor may be one developed by General Electric Company, U.S.A., and known by a trade name "PUT" (programable unijunction transistor). The oscillator is useful in triggering a silicon controlled rectifier.

It is impossible to make a sophisticated N-gate thyristor relaxation oscillator generate a high-frequency relaxation oscillation of the order of 1 kHz. With an improvement in an oscillator of the type described, it has turned possible to generate a high-frequency relaxation oscillation. The improvement, however, is still defective in that it is impossible to determine the frequency of the oscillation from design of the oscillator circuit and in that the frequency of oscillation is liable to change.

SUMMARY OF THE INVENTION

It is therefore an object of the present invention to provide an N-gate thyristor relaxation oscillator capable of generating a high-frequency oscillation such as, for example, at 3.5 kHz.

It is another object of this invention to provide a stably operable oscillator of the type described.

It is still another object of this invention to provide an oscillator of the type described capable of generating a relaxation oscillation of the frequency determined by the circuit design.

It is yet another object of this invention to provide an oscillator of the type described, that is readily comprised in an integrated circuit.

An N-gate thyristor relaxation oscillator comprises an N-gate thyristor having an anode, a cathode, and a gate electrode, means for biassing the gate electrode to a predetermined gate potential, a capacitor, means for charging the capacitor to develop a voltage thereacross, and means for supplying the voltage to the anode to develop an anode potential at the anode and to render the thyristor conductive when the anode potential exceeds the gate potential. In accordance with this invention, the oscillator further comprises a parallel circuit between the anode and cathode. The parallel circuit should be operable as a constant current circuit when the thyristor is rendered conductive.

DESCRIPTION OF THE PREFERRED EMBODIMENTS

Before describing some preferred embodiments of the present invention, a few conventional N-gate thyristor relaxation oscillators will be illustrated in order to facilitate an understanding of this invention.

Figure 1:
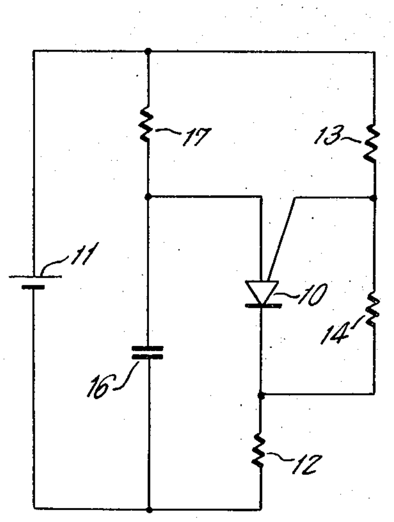
PRIOR ART FIG. 1.
FIG. 1 schematically shows the circuit of a sophisticated N-gate thyristor relaxation oscillator.

Referring to FIG. 1, a sophisticated N-gate thyristor relaxation oscillator, such as described in "GE Semiconductor Data Handbook," page 705, comprises an N-gate thyristor 10, an electric power source 11 for the oscillator, a load resistor 12 connected between the power source 11 and the cathode of the thyristor 10, a pair of potentiometer resistors 13 and 14 connected between the cathode and the power source 11 for biassing the gate electrode of the thyristor 10 to a predetermined gate potential, a capacitor 16 connected between the anode of the thyristor 10 and the remote end of the load resistor 12, and an anode resistor 17 for charging the capacitor 16 from the power source 11 to develop a voltage thereacross. The voltage developed across the capacitor 16 is supplied to the anode to develop an anode potential at the anode and to render the thyristor 10 conductive when the anode potential exceeds the gate potential.

With this oscillator, the frequency $f$ of the relaxation oscillation is given in the known manner by:

$$f = [CR.1n(1/[1-r])]^{-1}, \quad (1)$$

where $C$ represents the capacity of the capacitor 16, $R$ represents the resistance of the anode resistor 17, ln represents natural logarithm, and $r$ represents the ratio of potential division given by $$r = R_{14}/(R_{13} + R_{14}),$$

where, in turn, $R_{13}$ and $R_{14}$ represent the resistances of the potentiometer resistors 13 and 14. It is therefore necessary to reduce the anode resistance $R$ in order to raise the frequency $f$. However, this results in an increase in the current flowing through the thyristor 10 when the capacitor 16 is discharged so that the current does not decrease below the valley current $I_v$ of the thyristor 10 at which the thyristor 10 put into the conductive state turns off. In other words, it has been impossible to make the circuit depicted in FIG. 1 generate as high a relaxation oscillation as 1 kHz. More particularly, each of the potentiometer resistances $R_{13}$ and $R_{14}$ may be 10 kilohms, when $r = 0.5$. Inasmuch as appreciably wide pulses are required to drive a silicon controlled rectifier, the capacity C should be at least 0.2 microfarad. On the other hand, the valley current $I_v$ of an N-gate thyristor is considerably smaller than and linearly proportional to the gate current $I_G$ flowing into the gate electrode while the thyristor is conductive although the gate current depends on the resistance of the gate circuit, such as the resistance of the resistor 13. Inasmuch as a resistance of 10 kilohms is selected for this resistance, the gate current $I_G$ is now 2 mA with a source voltage of 20 V. If $I_v/I_G$ is equal to 1/10, the valley current $I_v$ is 0.2 mA. It is now understood that an anode resistance exceeding 100 kilohms is necessary in order to reduce the anode c of thyristor 10 below the valldy current $I_v$. With these numerical values, the frequency $f$ calculatdd by Equation (1) is as low as about 71 Hz.

Figure 2:
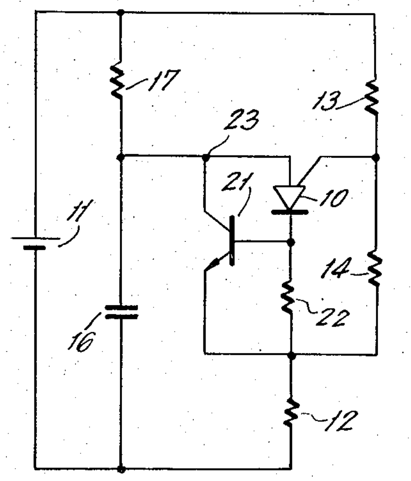
PRIOR ART FIG. 2.
FIG. 2 similarly shows the circuit of a conventional but improved N-gate thyristor relaxation oscillator.

Referring to FIG 2, a conventional but improved N-gate thyristor relaxation oscillator comprises a transistor 21 whose base-collector junction is connected between the anode and cathode of the thyristor 10 and a biassing resistor 22 for the transistor 21 connected between the emitter and base electrodes of the transistor 21. The emitter electrode of the transistor 21 is connected to a junction point of the load resistor 12 and the biassing resistor 22.

In operation, no voltage is applied across the base-emitter junction of the transistor 21 while the thyristor 10 is off so that the transistor 21 is also inoperative. As the charge is accumulated in the capacitor 16, the anode potential will exceed the gate potential given by a sum of the voltage drop developed across the resistor 14 and the offset voltage for the thyristor 10 given by the load resistor 12, to render the thyristor 10 conductive. The cathode current $I_K$ of the thyristor 10 flows through the biassing resistor 22 to turn the transistor 21 on. The discharge current of the capacitor 16 therefore partly flows through the collector electrode of the transistor 21 to develop a pulse voltage across the load resistor 12. Inasmuch as the collector current $I_C$ of the transistor 21 is about $h_{FE}$ times the cathode current $I_K$, $$I_C = h_{FE}(I_A + I_G),$$

where $h_{FE}$ represents the current amplification of the transistor 21. Consequently, the anode current $I_A$ decreases below the valley current $I_v$ before completion of discharge of the capacitor 16 to turn the thyristor 10 off.

In connection with turning off of the thyristor 10 described above, it is to be noticed that the current flowing to a junction point 23 of the anode of the thyristor 10 and the collector electrode of the transistor 21 is an apparent valley current $I_v'$, which is given by:

$$I_v' = (I_v + I_G)h_{FE} + I_v \approx h_{FE}I_G \qquad (2)$$

because the valley current $I_v$ is about 10 times as small as the gate current $I_G$. In other words, the apparent valley current $I_v'$ is about $h_{FE}/k$ times as large as the true valley current $I_v$ where $k$ represents the ratio $I_v/I_G$ which is typically equal to 1/10. It is therefore possible with the circuit illustrated with reference to FIG. 2 to use a small anode resistance and raise the frequency of the relaxation oscillation.

In connection with the circuit illustrated with reference to FIG. 2, it should be mentioned here that $$I_G = (E - I_v'R_{12})/R_{13},$$

where $E$ represents the source voltage and $R_{12}$ represents the resistance of the load resistor 12. As a result, the apparent valley current $I_v'$ given by Equation (2) depends on the current amplification $h_{FE}$, the load resistance $R_{12}$, and so forth. It is therefore impossible to determine the highest operable frequency of the relaxation oscillator. In addition, the frequency of oscillation is liable to change due to fluctuation of characteristics of the transistor 21.

Figure 3:
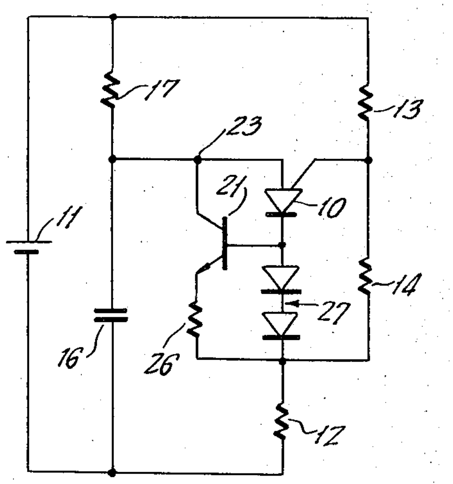
FIG. 3 similarly shows the circuit of a first embodiment of the instant invention.

Referring now to FIG. 3, a first embodiment of this invention is similar in construction to the relaxation oscillator illustrated with reference to FIG. 2, comprising similar components designated with like reference numerals. The first embodiment, however, comprises an emitter resistor 26 connected between the emitter electrode of the transistor 21 and a junction point of the load resistor 12 and the potentiometer resistor 14 and two diodes, generally shown at 27, connected between the cathode of the thyristor 10 and the last-mentioned junction point in the forward direction of the diodes 27.

In operation, the transistor 21 is inoperative as in the circuit illustrated with reference to FIG. 2 when the thyristor 10 is nonconductive. When the voltage across the capacitor 16 exceeds the gate potential provided by the resistors 12 through 14, the thyristor 10 is turned on. The capacitor 16 is discharged through the thyristor 10, diodes 27, and load resistor 12 to produce a forward voltage and a pulse voltage across the diodes 27 and load resistor 12, respectively. The forward voltage biasses the base electrode of the transistor 21 to make an emitter current $I_E$ and a collector current $I_C$ flow in the transistor 21, which are given by:

$$I_E = (2V_f - V_{BE})/R_{26} \text{ and } I_C = \alpha I_E,$$

where $V_f$ represents the forward voltage across each of the diodes 27, $V_{BE}$ represents the base-emitter voltage of the transistor 21, $\alpha$ represents the current transfer ratio of the transistor 21 defined by $$\alpha = h_{FE}/(1 + h_{FE}),$$

and $R_{26}$ represents the resistance of the emitter resistor 26. Inasmuch as the forward voltage of the diodes 27 is of the constant voltage characteristics, the emitter and collector currents assume predetermined values $I_{EO}$ and $I_{CO}$. It follows therefore that a constant current $I_{CO}$ flows through the transistor 21 while the thyristor 10 is conductive. The remaining discharge current flows through the thyristor 10. When the discharge current decreases to a point where the current flowing to the junction point 23 from the capacitor 16 and from the source 11 through the anode resistor 17 becomes equal to the sum of the collector current $I_{CO}$ and the valley current $I_v$, the thyristor 10 and the transistor 21 are successively turned off.

In connection with the operation described above,, the current flowing to the junction point 23 at the moment when the thyristor 10 is turned off may be looked upon as the apparent valley current $I_v'$ as in the circuit illustrated with reference to FIG. 2. This current is now given by:

$$I_v' = \alpha(2V_f - V_{BE})/R_{26} + I_v$$
$$I_v' \approx (2V_f - V_{BE})/R_{26}$$
$$I_v' = I_{CO}$$

because the apparent valley current $I_v'$ is appreciably larger than the true valley current $I_v$ as has been described above in conjunction with the circuit illustrated with reference to FIG. 2. For example, the apparent valley current $I_v'$ is about 20 mA in contrast to the true valley current $I_v$ of, typically, 0.2 mA when the emitter resistance is 30 ohms and each of the forward voltage $V_f$ and base-emitter voltage $V_{BE}$ is 0.6 V. It has now turned clear that the circuit according to this invention is capable of generating a relaxation oscillation even with as low an anode resistance $R_{17}$ of 1 kilohm when use is made of a source voltage of 20 V as in the circuit illustrated with reference to FIG. 1. The frequency f of oscillation as calculated from Equation (1) is about 3.5 kHz.

Inasmuch as the apparent valley current $I_v'$ of a relaxation oscillator according to this invention depends on the constant current of a parallel circuit which, in turn, depends on the emitter resistance $R_{26}$ in the first embodiment, it is possible with this invention to raise the highest operable frequency of a relaxation oscillator having an N-gate thyristor. In addition, the current flowing through the parallel circuit is small as compared with the average current flowing through the thyristor 10. This makes it feasible to render the power loss in the parallel circuit small and to use, in the first embodiment, a transistor for small power.

Figure 4:
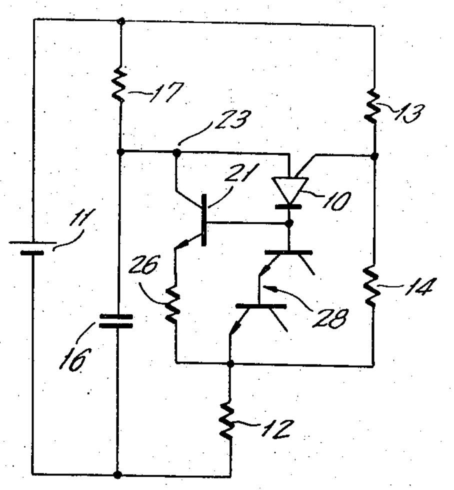
FIG. 4 similarly shows the circuit of a second embodiment of this invention.

Referring finally to FIG. 4, a second embodiment of this invention comprises base-emitter junctions of a pair of transistors, generally indicated at 28, connected in the Darlington fashion and in the forward direction in place of the diodes 27 as a constant voltage circuit. With this arrangement, it is possible to derive the output from a resistor (not shown) connected between the common collector electrodes of the transistors 28 and the positive terminal of the power source 11.

What is claimed is:

1. A relaxation oscillator including an N-gate thyristor having an anode, a cathode, and a gate electrode, means for biassing said gate electrode to a predetermined gate potential, a capacitor, means for charging said capacitor to develop a voltage thereacross, and means for supplying said voltage to said anode to develop an anode potential at said anode and to render said thyristor conductive when said anode potential exceeds said gate potential, wherein the improvement comprises a parallel circuit between said anode and cathode, said circuit being operable as a constant current circuit when said thyristor is rendered conductive.

2. An oscillator as claimed in claim 1, wherein said parallel circuit comprises a transistor having a base-collector junction thereof connected between said anode and cathode.

3. An oscillator as claimed in claim 2, said transistor having an emitter electrode and a base electrode, wherein said parallel circuit further comprises a constant voltage circuit connected between said emitter and base electrodes.

4. An oscillator as claimed in claim 3, wherein said constant voltage circuit comprises a diode connected between said emitter and base electrodes in forward direction thereof.

5. An oscillator as claimed in claim 3, wherein said constant voltage circuit comprises a base-emitter junction of a transistor connected between said emitter and base electrodes in forward direction of said base-emitter junction.

* * * * *